Oct. 17, 1967 G. DIEMER 3,348,074

PHOTOSENSITIVE SEMICONDUCTOR DEVICE EMPLOYING INDUCED SPACE CHARGE GENERATED BY PHOTOSENSOR

Filed June 30, 1965 2 Sheets-Sheet 1

INVENTOR.
GESINUS DIEMER

BY

Frank R. [signature]

AGENT

INVENTOR.
GESINUS DIEMER
BY
Frank R. Jeifari
AGENT

United States Patent Office 3,348,074

Patented Oct. 17, 1967

3,348,074

PHOTOSENSITIVE SEMICONDUCTOR DEVICE EMPLOYING INDUCED SPACE CHARGE GENERATED BY PHOTOSENSOR

Gesinus Diemer, Emmasingel, Eindhoven, Netherlands, assignor to North American Philips Company, Inc., New York, N.Y., a corporation of Delaware Filed June 30, 1965, Ser. No. 468,537
Claims priority, application Netherlands, July 1, 1964, 64—7,445
9 Claims. (Cl. 307—88.5)

ABSTRACT OF THE DISCLOSURE

A photosensitive semiconductor device of the field effect type exhibiting enhanced sensitivity. It comprises a semiconductor through which a current is passed separated by a blocking layer from a layer of photosensitive material having a sheet resistance and a thickness at which the potential gradient which is produced in the semiconductor also appears in the photosensitive layer. When the latter is irradiated, the potential gradient is reduced causing by capacitive action an increased space charge in the semiconductor which varies the current therein, which may be utilized.

This invention relates to photosensitive semiconductor devices comprising a semiconductor body having two connecting contacts for passing an electric current through the semiconductor body which current may be modulated by means of radiation and a gate electrode provided between the contacts on the semiconductor body.

The term "gate electrode provided between the contacts on the semiconductor body" is to be understood to mean a gate electrode which overlaps, at least in part, the portion of the semiconductor body which is present between the contacts.

Known devices of the above-mentioned kind are photosensitive field-effect transistors in which the gate electrode comprises a semiconductor layer which constitutes a photosensitive p-n junction with the semiconductor body which is provided with the two connecting contacts. By applying to the gate electrode a potential at which the p-n junction is biased in the blocking direction, a space charge in the form of a depletion region, that is to say a region from which the free charge carriers are extracted, is produced in the semiconductor body and can interrupt the current path between the two contacts. By irradiating the p-n junction it is possible to produce a photoelectric current passing the junction which current causes a voltage drop across an electrical resistor included in the circuit of the gate electrode, and thus an alteration in the biassing potential of the gate electrode which results in a decrease of the depletion region and modulation of the current flowing through the semiconductor body. The said devices have the advantage inter alia that their sensitivity to radiation may be higher by a factor of approximately 100 relative to that of a photo-transistor of good quality.

An object of the invention is inter alia to provide a new type of a photosensitive semiconductor device of the kind mentioned in the preamble which has a sensitivity even higher than that of the described known photosensitive field-effect transistors and which affords wide possibilities from a viewpoint of construction and switching technique.

According to the invention a photosensitive semiconductor device comprising a semiconductor body having two connecting contacts for passing a current through the semiconductor body which current may be modulated by means of radiation and a gate electrode provided between the contacts on the semiconductor body is characterized in that the gate electrode comprises a photosensitive layer separated from the semiconductor body by means of a blocking layer and having a sheet resistance in the dark and a thickness at which, upon passage of current through the semiconductor body and the consequent potential drop in the semiconductor body, a potential drop occurs in the photosensitive layer, at least in the portion thereof which is adjacent the blocking layer, and substantially parallel to the blocking layer, which potential drop may be decreased by increasing the conductivity of the photosensitive layer by irradiation, the resulting varying capacitive action between the gate electrode and the semiconductor body giving rise, at least locally, to an increasing space charge in the semiconductor body so that the current flowing through the semiconductor body is modulated.

In a photosensitive semiconductor device according to the invention it is thus possible in contrast with known photosensitive field-effect transistors, to obtain an increasing space charge by irradiation. Furthermore, in devices according to the invention, it is possible to utilise not only a space charge region in the form of a depletion region but also a space charge region in the form of an enhancement region, that is to say a region in which free charge carriers are attracted.

The operation of a photosensitive semiconductor device according to the invention is not based on the production of a photoelectric current as is the case in said known photosensitive field-effect transistors, but is based on increasing the conductivity of a photosensitive layer so that a very high sensitivity is obtainable.

The blocking layer between the photosensitive layer and the semiconductor body serves to prevent an eletctrical current between the gate electrode and the semiconductor body or to limit it to a leakage current which is not interfering. The said blocking layer may be formed, for example, by the junction between the semiconductor material of the semiconductor body and that of the photosensitive layer, which junction may be, for example, a blocking junction between two semiconductor materials having forbidden energy gaps of different widths (hetero junction) and/or a p-n junction between semiconductor materials of different conductivity types. In one advantageous embodiment the blocking layer comprises an electrically-insulating layer such as, for example, a silicon oxide layer, provided between the photosensitive layer and the semiconductor body. In this case the photosensitive layer may be biased either negatively or positively relative to the semiconductor body in contrast with the case where the blocking layer is formed, for example, by a p-n junction. Further there is greater freedom in the choice of the materials for the semiconductor body and the photosensitive layer since a blocking junction between these materials is not then required.

If the blocking layer comprises only a junction between two semiconductor materials it is necessary to prevent any flow of interfering photoelectric current through the said junction upon irradiation of the photosensitive layer. This may be achieved, for example, by giving the photosensitive layer a thickness and a doping concentration at which substantially no radiation can reach the near vicinity of the junction and/or by using for the photosensitive layer a photosensitive semiconductor material such as, for example, cadmium sulphide, in which only majority charge carriers are produced upon irradiation. In fact, as is well-known, the photoelectric current through, for example, a p-n junction is determined substantially by diffusing minority charge carriers.

It is advantageous to use a semiconductor body and a blocking layer which are substantially permeable to radiation corresponding to at least part of the wave-length region determined by the spectral sensitivity of the photosensitive layer. The semiconductor body then has a forbidden energy gap of a width which is larger than the quantum energy of the radiation to be detected. The possibility of an interfering photoconduction in the semiconductor body is thus limited or avoided, while the photosensitive layer can be irradiated through the semiconductor body and the blocking layer.

It is to be noted that the term "sheet resistance" is to be understood, as usual, to mean the resistance of a layer of material per square, that is to say, the resistance measured between two opposite sides of a square cut out of the layer.

The term "capacitive action between the gate electrode and the semiconductor body" is to be understood to mean the capacitance which occurs between the gate electrode and the semiconductor body and the space charge thus produced in the semiconductor body. Said capacitance, more particularly during irradiation of the photosensitive layer and due to the potential drop occurring in the semiconductor body, as a result of current passing through the body will differ from area to area per unit surface of the blocking layer when viewed in a direction from one connecting contact body of the semiconductor to the other. Consequently the space charge produced in the semiconductor body by the capacitive action per unit surface of the blocking layer will likewise differ from area to area in a direction from one connecting contact to the other.

In one very simple embodiment of a photosensitive semiconductor device according to the invention the gate electrode comprises only the photosensitive layer which is separated from the semiconductor body by the blocking layer. If the photosensitive layer has a high sheet resistance in the dark (that is to say when the photosensitive layer is not irradiated) a potential drop will occur in the photosensitive layer upon passage of current through the semiconductor body, which is parallel to the blocking layer and substantially equal to the potential drop which occurs in the portion of the semiconductor body which is adjacent the blocking layer. The capacitance between the gate electrode (photosensitive layer) and the semiconductor body is thus substantially zero and there is no capacitive action. If the photosensitive layer is made conducting by irradiation substantially no voltage drop can occur in this layer. The potential drop in this layer will thus decrease or disappear so that, in view of a permanent potential drop in the semiconductor body, a potential jump occurs across the blocking layer which differs from area to area viewed in a direction from one connecting contact to the other. Due to this potential jump, a capacitive action occurs between the photosensitive layer and the semiconductor body, thus producing space charge in the semiconductor body and the current flowing through the semiconductor body being modulated.

The photosensitive layer may have a connecting contact for applying to this layer a modulating voltage which determines the potential of the photosensitive layer in the conducting state. In this way the capacitive action may in addition be modulated electrically.

In one important preferred embodiment of a photosensitive semiconductor device according to the invention, the photosensitive layer is covered with a metal layer which may be permeable to radiation to which the photosensitive layer is sensitive so that this layer can simply be irradiated through the said metal layer. The metal layer is in practice an equipotential surface and the capacitive action between the gate electrode, if the photosensitive layer is not irradiated, and the semiconductor body is determined substantially by the capacitive action between the metal layer and the semiconductor body, the photosensitive layer and the blocking layer serving as the dielectric present between the plates of the capacitor formed by the metal layer and the semiconductor body. The capacitive action thus depends inter alia upon the total thickness of the photosensitive layer and the blocking layer. It will be evident that the capacitive action may be increased by decreasing the thickness of the dielectric. This may be achieved by making the photosensitive layer conducting by irradiation so that only the blocking layer still acts as a dielectric and the conducting photosensitive layer constitutes, together with the metal layer, one of the by means of irradiation, only space charge in the form plates of the capacitor. The thickness of the dielectric is then substantially limited to the thickness of the blocking layer. By increasing the capacitive action, space charge is produced in the semiconductor body and the current flowing through the semiconductor body will modulated. If the blocking layer is formed by an insulating layer the metal layer may have applied to it either a negative or a positive bias relative to the semiconductor body, it then being possible to produce in the semiconductor body either a space charge in the form of a depletion region or in the form of an enhancement region. It should be noted that by means of irradiation, only space charge in the form of a depletion region can be produced in the aforementioned known photosensitive field-effect transistors. It will be evident that the photosensitive layer must be thick enough relative to the blocking layer in order to obtain, by irradiation of this layer, a sufficient variation in capacitive action for modulating the current flowing through the semiconductor body.

In order that the invention may be readily carried into effect, several embodiments thereof will now be described in detail, by way of example, with reference to the accompanying diagrammatic drawings, in which.

Figure 1:
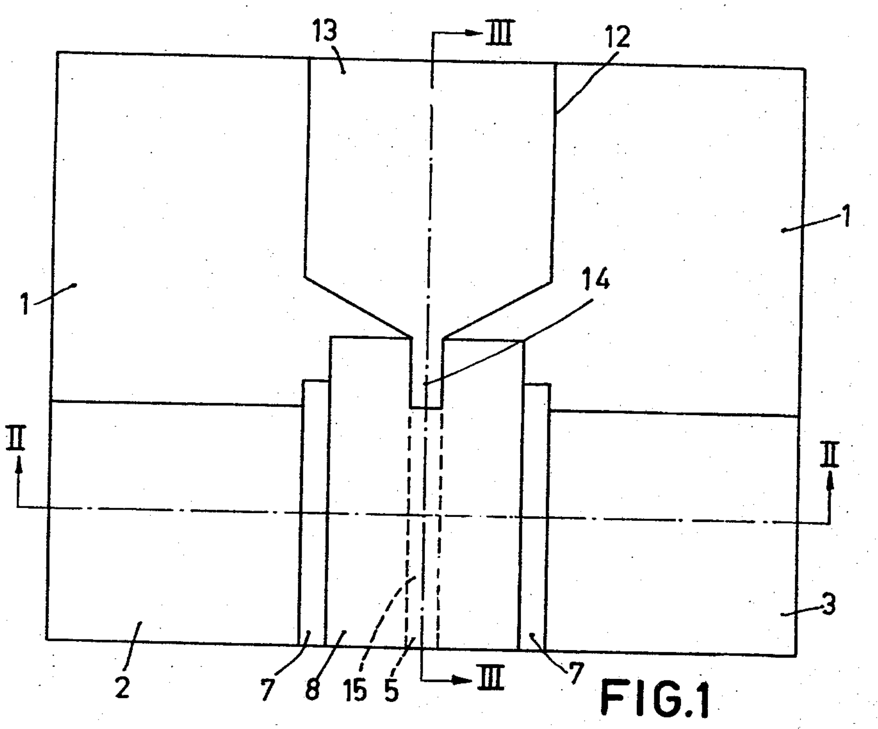
FIGURE 1 shows a plan view of an embodiment of a photosensitive semiconductor device according to the invention, of which embodiment
Figure 2:
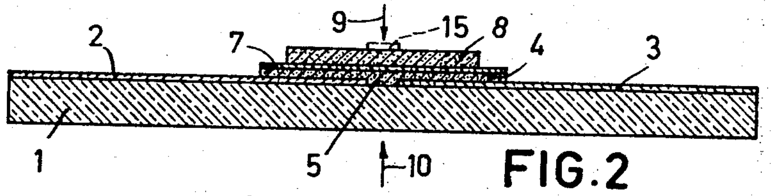
FIGURE 2 shows a cross-sectional view, taken on the line II—II, and FIGURE 3 a cross-sectional view, taken on the line III—III.
Figure 3:
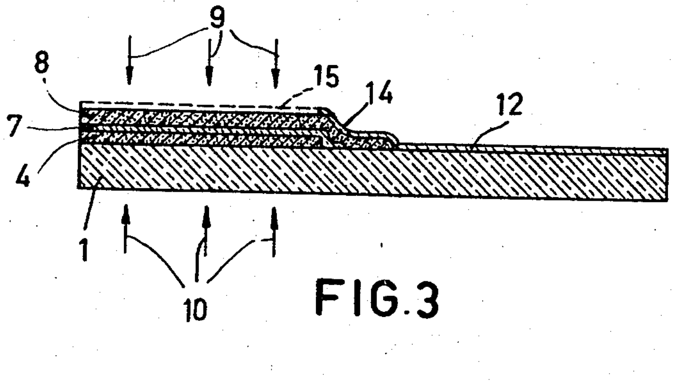

FIGURES 1, 2 and 3 show an embodiment of a photosensitive semiconductor device comprising a semiconductor body 4 having two connecting contacts 2 and 3 for passing an electric current through the semiconductor body 4. Said current may be controlled by means of irradiation 9 and a gate electrode 8 provided between the contacts 2 and 3 on the semiconductor body 4.

According to the invention the gate electrode comprises a photosensitive layer 8 separated from the semiconductor body 4 by means of a blocking layer and having a sheet resistance in the dark and a thickness at which, upon passage of current through the semiconductor body 4 and the consequent potential drop in this body, a potential drop occurs in the photosensitive layer 8, at least in the portion thereof which is adjacent the blocking layer, substantially parallel to the blocking layer, which potential drop may be decreased by increasing the conductivity of the photosensitive layer 8 by irradiation, the resulting varying capacitive action between the gate electrode 8 and the semiconductor body giving rise, at least locally, to an increased space charge in the semiconductor body so that the current flowing through the semiconductor body is modulated.

In one simple embodiment the gate electrode comprises only the photosensitive layer 8 which is separated from the semiconductor body 4 by the blocking layer 7.

The photosensitive semiconductor device shown in FIGURES 1, 2 and 3 may be built up as follows:

On a glass plate 1 having dimensions of approximately 2.5 mm. x 3 mm. there are provided the connecting contacts 2 and 3 which may consist of, for example, thin gold layers having a thickness of 200 A. Each of the connecting contacts 2 and 3 comprises a substantially rectangular, exposed portion of approximately 1 mm. x 1 mm. for contact purposes and a strip-shaped portion on which the semiconductor body 4 is provided. A gap 5 approximately 10$\mu$ wide exists between the strip-shaped portions of the connecting contacts 2 and 3. In FIGURE 1 the gap 5 is bounded approximately by the dashed lines. The connecting contacts 2 and 3 may be obtained by covering the glass plate 1 by evaporation with a gold layer and then providing the desired pattern for the contacts 2 and 3 in the usual manner using a photohardening lacquer (photoresist) and an etchant.

The semiconductor body 4 consists of, for example, a tin oxide layer having approximately $10^{18}$ free electrons per cm.$^3$ and dimensions of approximately 1 mm. x 1 mm. x 0.1$\mu$. The tin oxide layer 4 may be provided in the usual manner by evaporation.

The semiconductor body 4 is covered with a blocking layer in the form of an electrically-insulating layer 7 of silicon oxide which is approximately 0.1$\mu$ thick. This layer may be provided by evaporation in a manner which is usual in the semiconductor technique. In the same way the photosensitive layer 8 may be provided which lies on the blocking layer 7 and which, in the present example, consists of cadmium sulphide having a concentration of approximately $3\times10^{18}$ copper atoms per cm.$^3$ and a concentration of approximately $3\times10^{18}$ chlorine atoms per cm.$^3$. The cadmium sulphide layer 8 is approximately 2$\mu$ thick and has a resistivity in the dark of approximately $10^{12}$ $\Omega$-cm., that is to say a sheet resistance in the dark of $0.5\times10^{16}$ $\Omega$.

As may be seen from FIGURES 1 and 3, the resulting layer 7 and the photosensitive layer 8 project from the semiconductor body 4 on one side. This is not necessary but has been done to be able to provide in a simple manner a connecting contact 12 to the photosensitive layer 8, which will be described more fully hereinafter.

The photosensitive cadmium sulfide layer 8 is photosensitive to radiation 9 having wave-lengths located approximately in the region from 3500 A. to 9000 A., more particularly to radiation 9 having wave-lengths located approximately in the region from 5000 A. to 8500 A. Preferably only the portion of the photosensitive layer 8 located above the gap 5 is irradiated, the other portions of the photosensitive layer 8 being covered, for example, by a black lacquer layer (not shown). The photosensitive layer 8 may alternatively be irradiated through the glass plate 1, the semiconductor body 4 and the insulating layer 7 since these are permeable to radiation having wave-lengths located approximately in the region from 3500 A. to 8500 A. This may be advantageous if the photosensitive layer 8 is covered with a metal layer since this metal layer need not then be light-transmitting.

A photosensitive semiconductor device as shown in FIGURES 1 and 2 may have a sensitivity of approximately $10^{10}$ amps./lumen for green light and an operating voltage of 3 volts between the electrodes 2 and 3. This is a sensitivity which is considerably higher than that of the described known photosensitive field-effect transistors which may have a sensitivity of approximately 100 amps./lumen.

Figure 4:
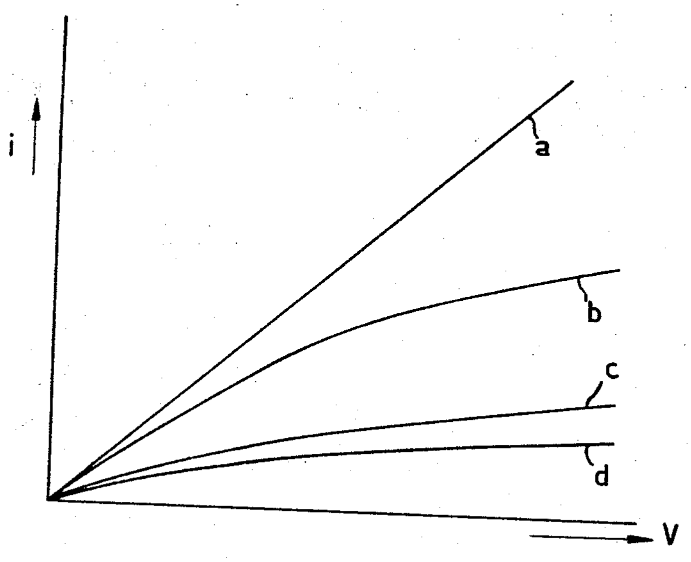
FIGURES 4 and 5 show current-voltage curves relating to two different embodiments of photosensitive semiconductor devices according to the invention.

In FIGURE 4 the current $i$ flowing through the semiconductor body 4 is plotted in arbitrary units against the voltage V between the contacts 2 and 3, likewise in arbitrary units, for several intensities of the radiation 9. Curve $a$ is substantially a straight line and obtained in the absence of the radiation 9. Curves $b$, $c$ and $d$ are obtained with increasing intensities of the radiation 9. It should be noted that with great intensities of the radiation 9, the curves of the kind shown in FIGURE 4 are located closer to one another than with low intensities of the radiation 9.

Upon illumination of the photosensitive layer 8, the current flowing in the semiconductor 4 between the contacts 2 and 3 is found to decrease. This may be appreciated as follows:

If the photosensitive layer is not irradiated and if the contact 3 is biased, for example, positively relative to the contact 2, a potential drop occurs in the semiconductor body 4 due to passage of current. Because of the high sheet resistance of the photosensitive layer 8, substantially an equal potential drop will occur in this layer in parallel with the blocking layer 7. Thus there will be substantially no potential jump across the blocking layer so that no capacitive action can occur. If, now, the photosensitive layer 8 becomes conducting due to irradiation, the potential drop in this layer will decrease or disappear whereas the potential drop in the semiconductor body 4 is retained. The layer 8 will then assume a potential located between the potentials of the contacts 2 and 3, and since the semiconductor body 4 has n-type conductivity, a depletion region will occur in the semiconductor body 4 at the contact 13 resulting in the passage of current through the semiconductor body 4 being limited. It is possible that an enhancement region simultaneously occurs at the contact 2, but the influence thereof is small relative to that of the depletion region.

During irradiation of the photosensitive layer 8, the capacitive action between this layer and the semiconductor body is favourably affected by a blocking layer 7 which is as thin as possible. The layer 7 will therefore be made as thin as possible. Very thin insulating layers having a thickness of 50 A. to 100 A. may be obtained, for example, by providing on the semiconductor body 4 an organic polymerized layer (plastic layer) by evaporating on the body a monomer during electron bombardment, resulting in polymerisation.

The gate electrode may advantageously have a connecting contact 12 which is connected to the photosensitive layer 8. By connecting the said contact to an adjustable voltage source, it is possible to adjust and/or modulate the potential assumed by the photosensitive layer 8 during irradiation so that the space charge produced in, and the passage of current through, the semiconductor body may, in addition, be modulated electrically.

The connecting contact 12 may be, for example, an evaporation-deposited gold layer of approximately 500 A. thick. The contact 12 comprises a portion 13 located on the glass plate 1 and intended for contact purposes and a portion 14 located on the photosensitive layer 8 and making contact therewith, which portion 14 in the plan view of FIGURE 1 reaches substantially up to the gap 5 shown in dashed lines (see for the gap 5 also FIGURE 2).

In one important embodiment of a photosensitive semiconductor device according to the invention the gate electrode comprises a metal layer applied to the photosensitive layer. This embodiment may have a structure similar to that which has been described with reference to FIGURES 1, 2 and 3, except that the metal layer 15 shown in dashed lines in the said figures is applied to the photosensitive layer 8. The metal layer 15 lies above the gap 5 (see FIGURE 2) and coincides with the gap 5 in the plan view of FIGURE 1. The metal layer 15 preferably does not extend above the contacts 2 and 3 in order to limit the possibility of parasitic capacitances. The metal layer 15 may simply be an extension of the connecting contact 12.

The photosensitive layer 8 can in this case be irradiated with radiation 10 through the glass plate 1, the semiconductor body 4 and the blocking layer 7, which are substantially permeable to radiation corresponding to the wave-length region determined by the spectral sensitivity of the photosensitive layer 8.

The metal layer 15 may be connected to a biasing potential. A capacitive action occurs between the metal layer 15 and the semiconductor body 4, which is determined by the potentials of the contacts 2, 3 and of the metal layer 15 and, if the photosensitive layer 8 is not irradiated, by the total thickness of the photosensitive layer 8 and the blocking layer 7. The metal layer 15 and the semiconductor body may thus be regarded as the plates of a capacitor in which the layers 7 and 8 constitute the dielectric. If the photosensitive layer 8 is made conducting by irradiation the metal layer 15 and the photosensitive layer 8 together constitute one of the plates of the capacitor, whereas the dielectric is limited to the blocking layer 7. The thickness of the dielectric may thus be reduced by irradiation from the total thickness of the layers 7 and 8 to that of the layer 7, which means a considerable decrease in thickness of the dielectric so that the capacitive action of the capacitor can increase considerably and hence the current flowing through the semiconductor body can be modulated strongly. It will be evident that the photosensitive layer 8 must be thick with respect to the blocking layer 7 for obtaining a strong modulation.

Figure 5:
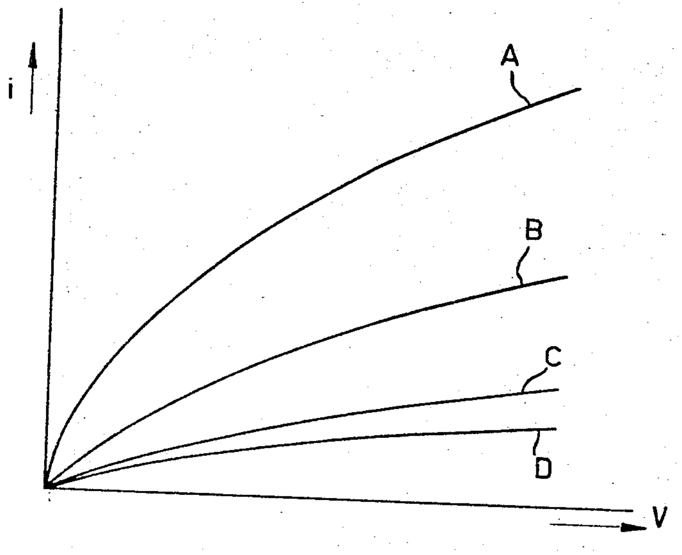

If, for example, the contact 3 is biased positively relative to the contact 2 and if the metal layer 15 is connected to the contact 2 or biased negatively relative to the contact 2, an increasing depletion region will be formed in the n-type semiconductor body 4 by irradiation. In FIGURE 5 the current *i* flowing through the semiconductor body is plotted in arbitrary units against the voltage V between the contacts 2 and 3, likewise in arbitrary units, for several intensities of the irradiation 10 (the contact 3 is biased positively relative to the contact 2) with the metal layer 15 connected to the contact 2, that is to say, the metal layer 15 and the contact 2 have the same potential. Curve A is obtained in the absence of the radiation 10. Curves B, C and D have been obtained with increasing intensities of the radiation 10. It is to be noted that curves of the kind shown in FIGURE 5 are located closer to one another at high intensities than at low intensities of the radiation 10. If the metal layer 15 is biased negatively relative to the contact 2, curves located closer to one another are obtained for the same intensities at which the curves A to D are obtained. This implies a decreasing sensitivity. If the metal layer 15 is biased positively relative to the contact 2 (but with a negative potential relative to the contact 3) the curves are more spaced from one another, which implies a higher sensitivity. If the metal layer 15 is biased positively relative to the contact 2 and the potential difference between the metal layer 15 and the contact 2 is greater than that between the contacts 3 and 2, no depletion region is obtained by irradiation. In this case an enhancement region is obtained by which the current flowing through the semiconductor body 4 can be modulated, i.e., increased. If it is desired to modulate by means of an enhancement region, it is preferable, however, to use a semiconductor body 4 having a resistivity which is higher than that of the tin-oxide layer 4 used in the present example.

The metal layer 15 may be made transparent so that the photosensitive layer 8 can be irradiated by irradiation 9 from above. This may be advantageous in view of possible choices of the materials for the semiconductor body 4 and the blocking layer 7 since these need not then be transparent to the radiation 10. The metal layer 15 may be transparent, for example, because of its small thickness, or by giving it a grating like form.

It is to be noted that the invention is not limited to the embodiments described and that within the scope of the invention for one skilled in the art many modifications are possible. In cases where the photosensitive layer is irradiated directly or through a metal layer provided on it, the blocking layer may consist of an opaque insulating layer, for example, a black lacquer layer, in order to minimize the possibility of interfering photoelectric conduction in the semiconductor body. Also materials other than those specified can be used for the semiconductor body and the photosensitive layer. Thus, for example, the photosensitive layer may consist of cadmium selenide. Furthermore the photosensitive layer may be applied directly on the semiconductor body, the blocking layer being formed by the junction between the materials of the photosensitive layer and of the semiconductor body. This junction may be a junction between materials having forbidden energy gaps of different widths (hetero-junction) and/or a p-n junction which may be biased in the blocking direction during operation. The semiconductor body may then consist of, for example, germanium and the photosensitive layer may be of gallium phosphide. The occurrence of an interfering photoelectric current through the junction may be avoided by suitable choice of the thickness and the doping concentration of the photosensitive layer.

What is claimed is:

1. A photosensitive semiconductor device comprising a semicondutcor body, spaced contacts to the semiconductor body, means for applying a voltage across the contacts to establish in the body in a direction substantially parallel to a surface of the body a potential gradient and a flow of current therethrough, a body of photosensitive material located adjacent the said surface of the body and separated threfrom by a blocking layer, said body of photosensitive material having a high dark sheet resistance and a thickness at which, at least in the photosensitive material portion adjacent the junction and substantially parallel thereto, there appears a potential gradient corresponding to that which exists in the semiconductor body when the voltage is applied, means for irradiating the photosensitive body with radiation which increases its conductivity without directly varying the conductivity of the semiconductor causing a reduction in the potential gradient in the photosensitive body producing by capacitive action an increased space charge in the semiconductor body which decreases the current therein, and means connected to the semiconductor contacts for utilizing the decrease in current through the semiconductor body.

2. A device as set forth in claim 1 wherein the blocking layer is an electrically-insulating layer between the semiconductor body and the photosensitive body.

3. A device as set forth in claim 1 wherein the semiconductor body and the blocking layer are substantially transparent to the radiation which changes the conductivity of the photosensitive body.

4. A photosensitive semiconductor device comprising a semiconductor layer, spaced contacts to the semiconductor layer, means for applying a direct-current voltage across the contacts to establish in the layer in a direction substantially parallel to a major surface of the layer a potential gradient and a flow of current therethrough, a layer of photosensitive material on the said surface of the semiconductor layer and separated therefrom by a blocking layer, a connection to said photosensitive layer, said layer of photosensitive material having a high dark sheet resistance and a thickness at which at least in the photosensitive material portion adjacent the junction and substantially parallel thereto, there appears a potential gradient corresponding to that which exists in the semiconductor layer when the voltage is applied, means for irradiating the photosensitive layer with radiation which increases its conductivity without directly varying the conductivity of the semiconductor causing a reduction in the potential gradient in the photosensitive layer producing by capacitive action an increased space charge in the semiconductor layer which decreases the current therein, and means connected to the semiconductor contacts for utilizing the decrease in current through the semiconductor.

5. A device as set forth in claim 4 wherein the connection to the photosensitive layer comprises a metal layer on the latter.

6. A device as set forth in claim 5 wherein the metal layer is transparent to the radiation which changes the conductivity of the photosensitive layer.

7. A device as set forth in claim 6 wherein the semiconductor layer is also transparent to the said radiation.

8. A photosensitive semiconductor device comprising a semiconductor layer, spaced contacts to the semiconductor layer, means for applying a voltage across the contacts to establish in the layer in a direction substantially parallel to a major surface of the layer a potential gradient and a flow of current therethrough, a layer of photosensitive material on the said surface of the semiconductor layer and separated therefrom by a blocking layer, a connection to said photosensitive layer, said layer of photosensitive material having a dark sheet resistance and a thickness at which at least in the photosensitive material portion adjacent the junction and substantially parallel thereto, there appears a potential gradient corresponding to that which exists in the semiconductor layer when the voltage is applied, means for irradiating the photosensitive layer with radiation which increases its conductivity without directly varying the conductivity of the semiconductor causing a reduction in the potential gradient in the photosensitive layer producing by capacitive action an increased space charge in the semiconductor layer which varies the current therein, and means connected to the semiconductor contacts for utilizing the change in current through the semiconductor.

9. A device as set forth in claim 8 wherein the connection to the photosensitive layer comprises a metal layer covering the latter, and a voltage is applied to the said metal layer at which the increased space charge is in the form of an enhancement region which increases the current through the semiconductor.

References Cited

UNITED STATES PATENTS

| | | | |
|---|---|---|---|
| 3,005,107 | 10/1961 | Weinstein | 317—235 |
| 3,028,500 | 4/1962 | Wallmark | 317—235 |
| 3,051,840 | 8/1962 | Davis | 317—235 |
| 3,117,229 | 1/1964 | Friedland | 317—235 |
| 3,211,911 | 10/1965 | Ruhge | 307—88.5 X |
| 3,300,644 | 1/1967 | Zemel et al. | 317—235 |

OTHER REFERENCES

IBM Technical Disclosure Bulletin, vol. 4, No. 3, August 1961, p. 91.

IBM Technical Disclosure Bulletin, vol. 7, No. 4, September 1964, pp. 338 and 339.

JOHN W. HUCKERT, *Primary Examiner.*

JAMES D. KALLAM, *Examiner.*

R. F. POLISSACK, *Assistant Examiner.*

UNITED STATES PATENT OFFICE

CERTIFICATE OF CORRECTION

Patent No. 3,348,074 October 17, 1967

Gesinus Diemer

It is hereby certified that error appears in the above numbered patent requiring correction and that the said Letters Patent should read as corrected below.

Column 4, lines 6 to 8, strike out "layer constitutes, together with the metal layer, one of the by means of irradiation, only space charge in the form plates of the capacitor. The thickness of the dielectric is" and insert instead -- layer constitutes, together with the metal layer, one of the plates of the capacitor. The thickness of the dielectric is --.

Signed and sealed this 12th day of November 1968.

(SEAL)
Attest:

Edward M. Fletcher, Jr.
Attesting Officer

EDWARD J. BRENNER
Commissioner of Patents